US012696424B2

(12) United States Patent
Saraidaridis et al.

(10) Patent No.: US 12,696,424 B2
(45) Date of Patent: Jul. 28, 2026

(54) PASSIVE, POROUS, PHASE-CHANGE COLD PLATE

(71) Applicant: Raytheon Company, Waltham, MA (US)

(72) Inventors: James D. Saraidaridis, Hartford, CT (US); Malcolm P. MacDonald, Bloomfield, CT (US); Robert M. Darling, South Windsor, CT (US); Craig H. McCordic, Medfield, MA (US); James S. Wilson, Hurst, TX (US)

(73) Assignee: RAYTHEON COMPANY, Arlington, VA (US)

( * ) Notice: Subject to any disclaimer, the term of this patent is extended or adjusted under 35 U.S.C. 154(b) by 337 days.

(21) Appl. No.: 18/298,185

(22) Filed: Apr. 10, 2023

(65) Prior Publication Data

US 2024/0341063 A1     Oct. 10, 2024

(51) Int. Cl.
*H05K 7/20*     (2006.01)
*F28F 7/02*     (2006.01)
*F42B 15/34*     (2006.01)

(52) U.S. Cl.
CPC .......... *H05K 7/20327* (2013.01); *F28F 7/02* (2013.01); *H05K 7/20336* (2013.01); *F42B 15/34* (2013.01)

(58) Field of Classification Search
CPC ... H05K 7/20327; H05K 7/20336; F28F 7/02; F42B 15/34
See application file for complete search history.

(56) References Cited

U.S. PATENT DOCUMENTS

| | | | | |
|---|---|---|---|---|
| 2,925,722 A | * | 2/1960 | Blackburn | B64D 13/08 |
| | | | | 62/223 |
| 4,341,000 A | * | 7/1982 | Stockman | B23P 15/26 |
| | | | | 29/890.032 |
| 4,673,030 A | * | 6/1987 | Basiulis | G05D 23/01 |
| | | | | 165/41 |
| 5,325,913 A | | 7/1994 | Altoz | |
| 8,356,410 B2 | | 1/2013 | Zhao et al. | |
| 10,935,325 B2 | | 3/2021 | Ben-Menahem et al. | |
| 2003/0047103 A1 | | 3/2003 | Rabin | |
| 2008/0279485 A1 | * | 11/2008 | Steele | B31B 70/00 |
| | | | | 383/63 |
| 2009/0145575 A1 | * | 6/2009 | Hogan | F28D 20/0034 |
| | | | | 165/10 |
| 2017/0064868 A1 | * | 3/2017 | Rush | F28D 15/0233 |
| 2019/0170406 A1 | * | 6/2019 | Wilson | F25B 19/00 |
| 2019/0390911 A1 | * | 12/2019 | Bunch | H05K 7/20372 |
| 2022/0221231 A1 | | 7/2022 | Lee et al. | |

OTHER PUBLICATIONS

International Search Report and Written Opinion for PCT Application No. PCT/US2024/023050, Dated Jul. 26, 2024, pp. 11.
International Preliminary Report on Patentability dated Oct. 8, 2025, for corresponding PCT Application No. PCT/US2024/023050.

* cited by examiner

*Primary Examiner* — Gordon A Jones
(74) *Attorney, Agent, or Firm* — Kinney & Lange, P.A.

(57)     ABSTRACT

A cold plate is disclosed for cooling electronics within a missile. The cold plate includes a housing enclosing a compartment. An outlet manifold is inside the compartment. A wick is inside the compartment and is adjacent to the outlet manifold. A liquid inlet is fluidically connected to the wick. A vapor outlet fluidically connects the outlet manifold to atmosphere or space.

18 Claims, 7 Drawing Sheets

PASSIVE, POROUS, PHASE-CHANGE COLD PLATE

BACKGROUND

This disclosure is directed to active cooling of electronic components and, more specifically, to active cooling of electronic components on missiles and other single-flight aircraft and spacecraft.

Missiles include electronics for steering and guidance, data gathering, and communication. Even though a missile is deployed for a single and relatively short mission life, the electronics on the missile need to survive the entire life of the missile. A deployed missile can experience extreme temperatures due to air friction on the skin of the missile and heat from the engine of the missile. The electronics inside the missile have relatively strict operating temperature limitations and thus need to be cooled to survive these extreme temperatures. Intricate cooling systems with motors, pumps, large reservoirs, and heat pipes are generally too heavy, bulky, and expensive to include in a missile or other aircraft that will only last a single mission. Some missiles travel above the atmosphere and into space. Cooling systems on these missiles must be able to operate under low gravity.

SUMMARY

A cold plate for cooling a heat source includes a housing enclosing a compartment. A liquid manifold is inside the compartment and a vapor manifold inside the compartment. A wick forms an interface between the liquid manifold and the vapor manifold. An inlet is fluidically connected with the liquid manifold, and an outlet fluidically connects the vapor manifold to atmosphere or space. A liquid reservoir is fluidically connected to the liquid inlet.

A cold plate is disclosed for cooling electronics within a missile. The cold plate includes a housing enclosing a compartment. An outlet manifold is inside the compartment. A wick is inside the compartment and is adjacent to the outlet manifold. A liquid inlet is fluidically connected to the wick. A vapor outlet fluidically connects the outlet manifold to atmosphere or space.

DETAILED DESCRIPTION

A cold plate is disclosed that includes a porous wick located inside a manifold. The manifold is mounted on a heat source. A liquid is supplied to the porous wick and is absorbed by the wick. Heat from the heat source is absorbed by the liquid in the wick. As the liquid heats up, the liquid boils and vaporizes. The vapor can exit the manifold through a vapor outlet. The vapor outlet releases the vapor to atmosphere or an outside environment. The vapor is not condensed or recycled as this system is intended for cooling electronics on missiles or any other short-term, single-use craft. Enough liquid is provided to the manifold, or stored in the manifold, to last the short mission life of the electronics. In some embodiments of the cold plate, the wick can have gaps formed in the wick such that the wick has spaced apart fingers or digits. These gaps and spaces keep the wick from drying out because the liquid can replenish the wick at a rate sufficient to keep up with evaporation of the liquid from the wick.

The wick uses capillary forces to hold the liquid within the wick under low gravity conditions. A liquid reservoir can also be connected to the manifold of the cold plate to supply liquid to the wick under low gravity conditions. In some embodiments, circular balloon tanks can be connected to a perimeter of the manifold to supply liquid to the wick. The circular balloon tanks can include a rigid exterior with a flexible lining that collapses as the liquid is drawn from the tanks. In other embodiments, a liquid reservoir is connected to the manifold and includes a sponge in the liquid reservoir that is saturated by the liquid. An air bag is disposed in the liquid reservoir and expands to compress the sponge and push the liquid into the manifold when an atmospheric pressure outside of the liquid reservoir decreases. The cold plate is discussed in greater detail below with reference to FIGS. 1-13.

Figure 1:
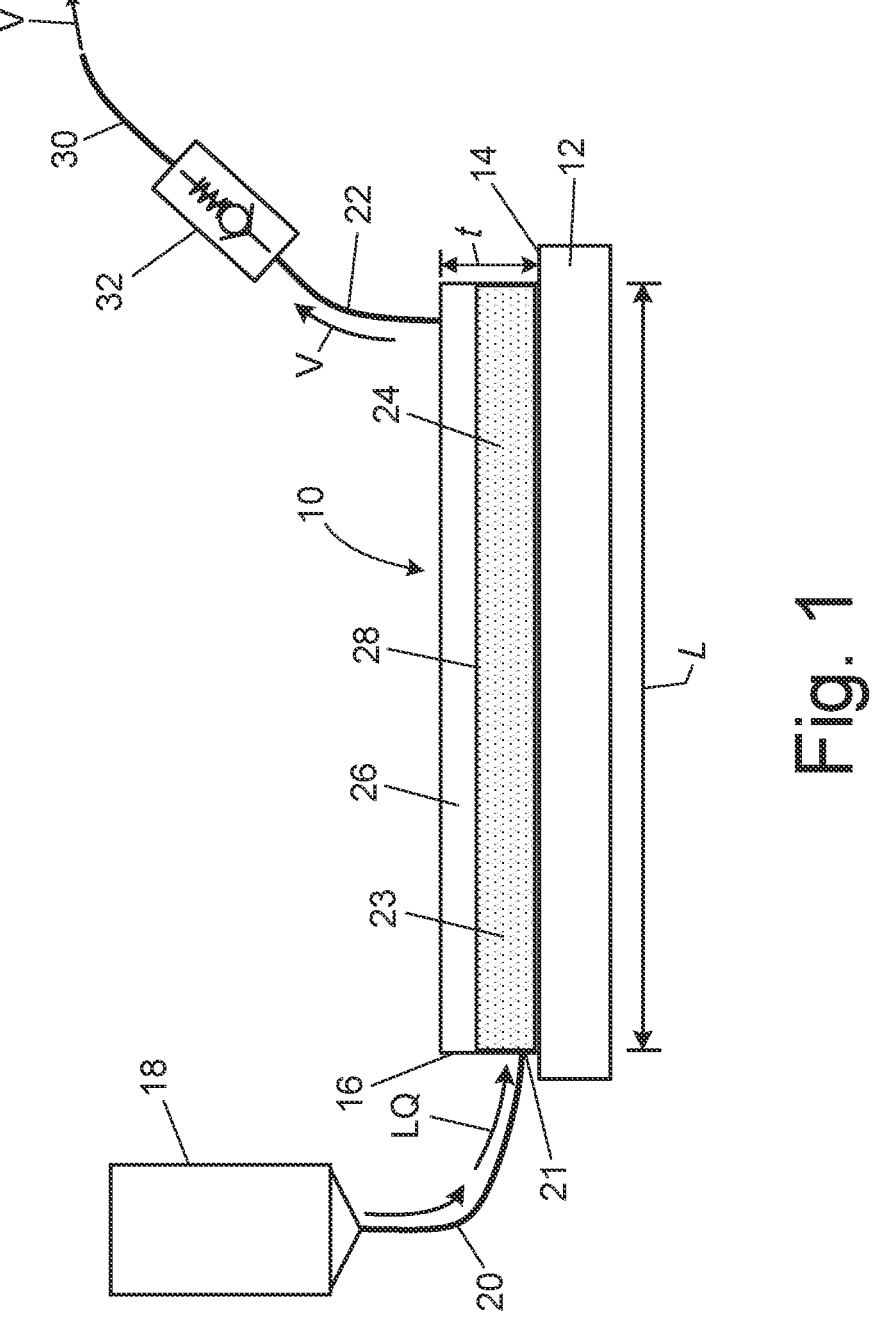
FIG. 1 is a simplified side cross-sectional view of a cold plate attached to a heat source and a liquid reservoir.
Figure 2:
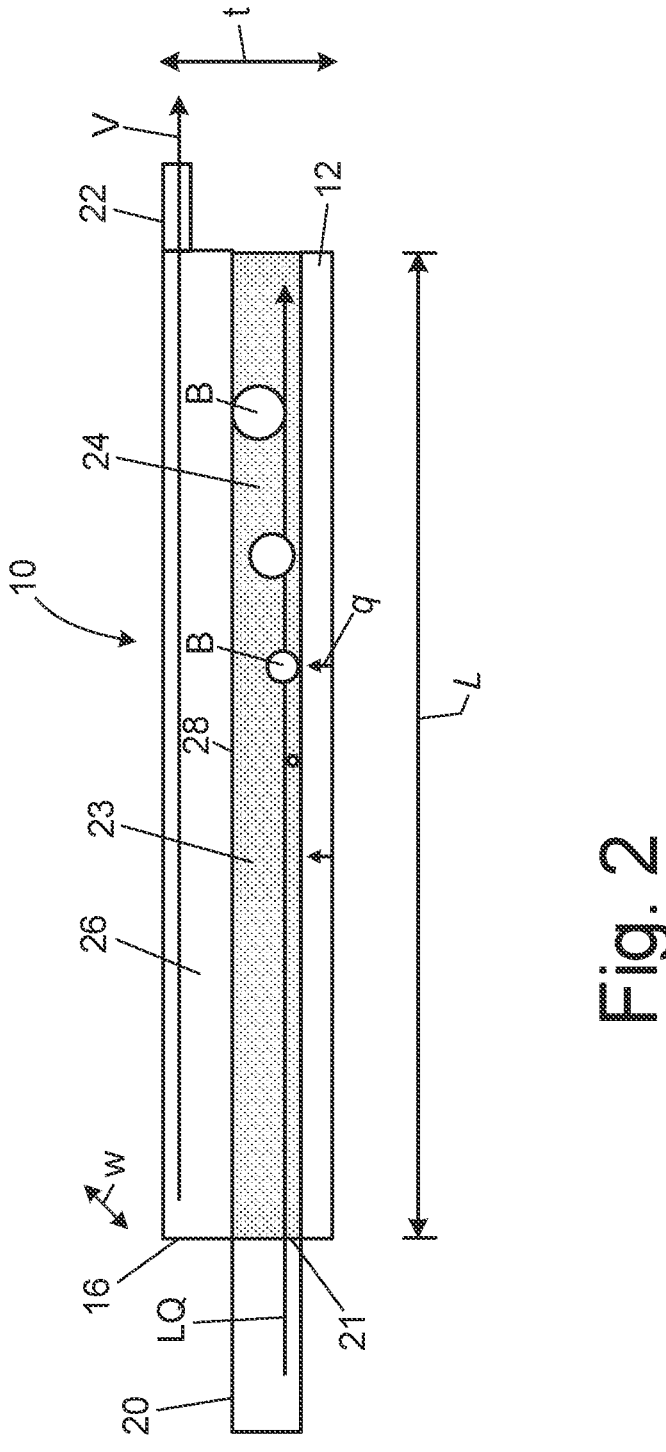
FIG. 2 is another simplified side cross-sectional view of the cold plate of FIG. 1.

FIGS. 1-2 will be discussed concurrently. FIGS. 1 and 2 show a simplified side cross-sectional view of cold plate 10 in a length L and thickness t plane. As shown in the example of FIGS. 1 and 2, cold plate 10 can be attached to surface 14 of heat source 12. Cold plate 10 includes housing 16, liquid reservoir 18, liquid line 20, liquid inlet 21, vapor outlet 22, liquid manifold 23, wick 24, vapor manifold 26, interface 28, vapor tube 30, and check valve 32.

Housing 16 of cold plate 10 encloses a compartment. Liquid manifold 23 and vapor manifold 26 are inside the compartment of housing 16. Liquid manifold 23 is against the side of housing 16 that is connected to heat source 12 and vapor manifold 26 opposes liquid manifold 23. Liquid manifold 23 forms an inlet manifold of cold plate 10 is the portion of the compartment inside housing 16 that receives and carries liquid LQ. Vapor manifold 26 forms an outlet manifold for cold plate 10 and is the portion of the compartment inside housing 16 that receives vapor V generated by the evaporation of liquid LQ in liquid manifold 23. Vapor manifold 26 can occupy a volume inside the compartment of housing 16 that is not occupied by liquid manifold 23. Wick 24 is inside housing 16 and is inside liquid manifold 23. Wick 24 forms interface 28 between liquid manifold 23 and vapor manifold 26.

Wick 24 comprises a material with a plurality of pores that extend through a thickness of wick 24. The plurality of pores of wick 24 are sized small enough that the plurality of pores can hold liquid LQ in wick 24 using capillary action. Wick 24 can be formed of any material that can absorb liquid LQ and hold liquid LQ under capillary action. For example, wick 24 can be formed from a synthetic sponge material, a metal or fabric felt, a metal or synthetic foam material, and/or porous sintered metal. The plurality of pores in wick 24 can be non-uniform in size. Making the plurality of pores non-uniform in size can help prevent vapor lock-up from occurring in wick 24 during operation of cold plate 10. In some examples, the plurality of pores can increase in size (i.e, cross-sectional area) as the plurality of pores extend toward interface 28. Increasing the size of the plurality of pores as the plurality of pores extend toward interface 28 can also help prevent vapor lock-up from occurring in wick 24. In the example of FIGS. 1 and 2, wick 24 fills all of liquid manifold 23 inside of the compartment of housing 16 or wick 24 can form liquid manifold 23. By including wick 24 in liquid manifold 23, liquid LQ in liquid manifold 23 is held in place against the side of housing 16 that abuts heat source 12. Because wick 24 holds liquid LQ in place against the side of housing 16 that abuts heat source 12, cold plate 10 can operate upside down or in a low gravity environment, such as space.

Liquid inlet 21 can extend through housing 16 to fluidically connect liquid manifold 23 and wick 24 to liquid reservoir 18. Liquid line 10 fluidically connects liquid reservoir 18 to liquid inlet 21. Liquid reservoir 18 is a reservoir external to housing 16 that supplies liquid LQ to liquid manifold 23 and wick 24 to keep wick 24 charged with liquid LQ as liquid LQ evaporates from wick 24 during operation of cold plate 10. In some examples, cold plate 10 can be sized to hold enough liquid LQ within liquid manifold 23 and wick 24 to last an entire operational life of cold plate 10 such that liquid reservoir 18 can be omitted. Liquid LQ can be water, an alcohol, ammonia, a water-ammonia mixture, a water-alcohol mixture, or any other similar liquid.

Vapor outlet 22 extends through housing 16 to fluidically connect to vapor manifold 26. Vapor tube 30 is connected to vapor outlet 22 to direct vapor V that exits out of vapor manifold 26. Vapor tube 30 can fluidically connect vapor outlet 22 to an external environment, such as atmosphere or space. For example, if cold plate 10 is connected to electronics within a missile, vapor tube 30 can vent cold plate 10 to an exterior of the missile, or to a safe space within the missile. Check valve 32 is fluidically connected to vapor outlet 22 and fluidically connects vapor outlet 22 to vapor tube 30. Check valve 32 is designed to open when the pressure difference between the compartment of housing 16 and the vapor outlet conditions exceed an opening pressure of check valve 32. The opening pressure of check valve 32 is the pressure required to overcome a biasing force caused by a spring in check valve 32. If cold plate 10 is used in a low atmosphere environment, such as the stratosphere or space, check valve 32 keeps the compartment of housing 16 pressurized and prevents a vacuum from occurring within housing 16 that could cause liquid LQ to boil too quickly out of wick 24.

Figure 3:
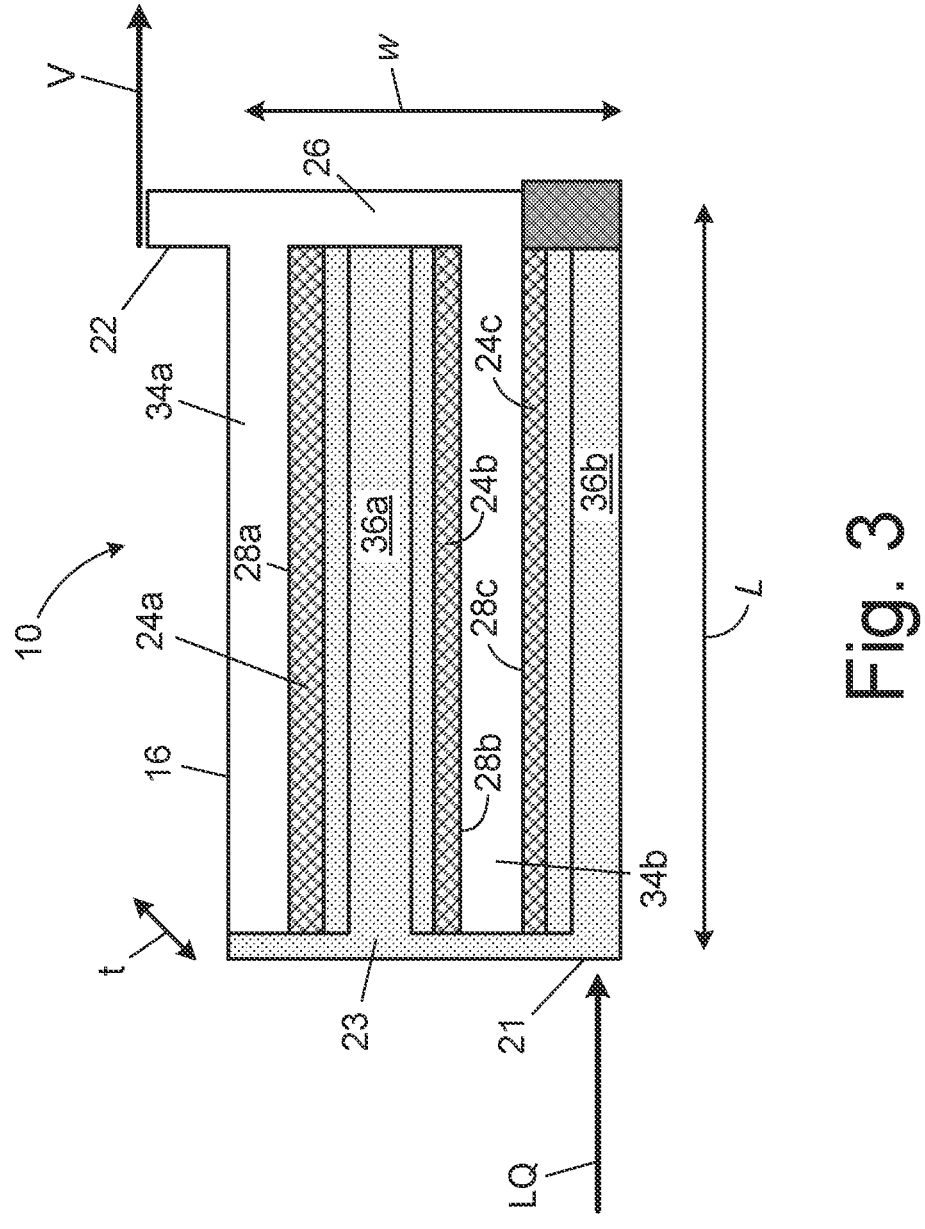
FIG. 3 is a simplified top cross-sectional view of a cold plate.
Figure 5:
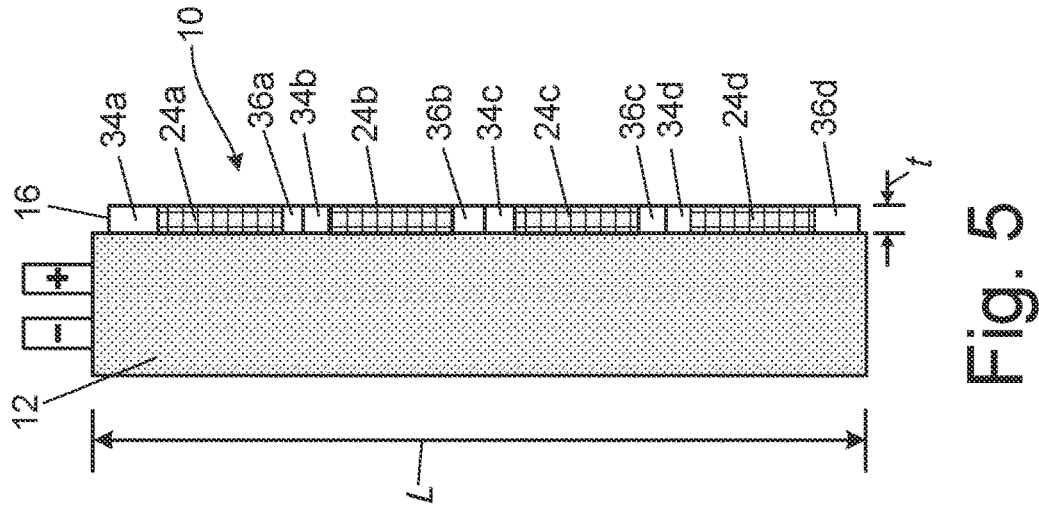
FIG. 5 is a simplified side cross-sectional view of the cold plate of FIG. 4.
Figure 4:
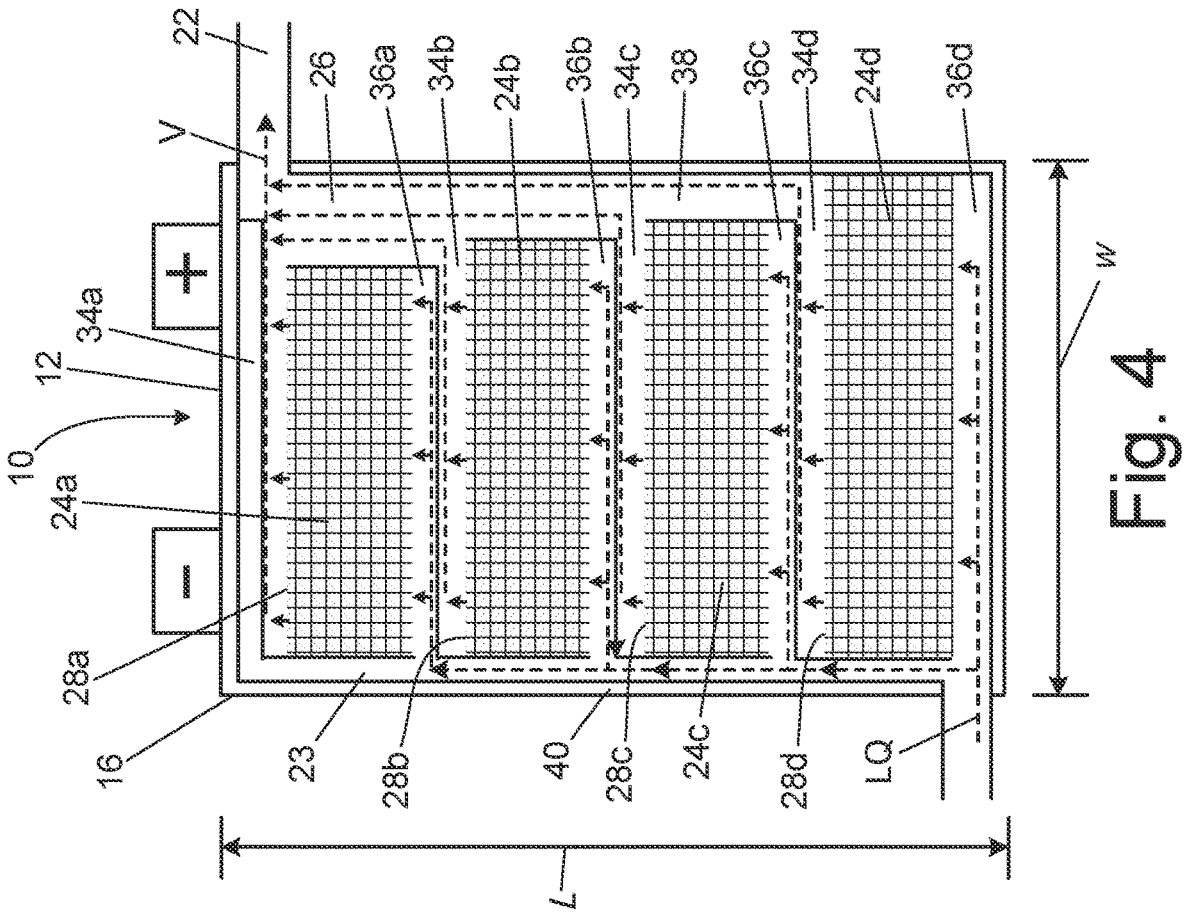
FIG. 4 is a simplified top cross-sectional view of another embodiment of a cold plate.

During the operation of cold plate 10 cold plate 10 is connected to surface 14 of heat source 12. Heat source 12 can be electronics or any device that requires cooling and operates for a single and relatively short deployment. Wick 24 is filled with liquid LQ and heat q from heat source 12 conducts through housing 16 of cold plate 10 and is absorbed by liquid LQ. As liquid LQ absorbs heat q from heat source 12, liquid LQ boils (as shown by vapor bubbles B in FIG. 2) and phase changes into vapor V. Vapor V exits wick 24 and enters vapor manifold 26. As vapor V exits wick 24, more liquid LQ enters liquid manifold 23 from liquid reservoir 18 and is absorbed by wick 24. As vapor V accumulates inside of vapor manifold 26, the pressure within housing 16 increases above the outlet pressure, thereby causing check valve 32 to open and allow vapor V to exit out of vapor manifold 26 through vapor outlet 22 and vapor tube 30 to an external environment, such as atmosphere or space. If heat source 12 and cold plate 10 flip upside down relative to ground, or if heat source 12 and cold plate 10 enter a low gravity environment, wick 24 keeps liquid LQ in contact with the side of housing 16 that is connected to heat source 12 such that cold plate 10 continues to cool heat source 12. Cold plate 10 holds enough liquid LQ within liquid manifold 23 and liquid reservoir 18 to cool heat source 12 for an entire operational lifespan of heat source 12. Since cold plate 10 does not include any mechanical pumps, condensers, or recirculation lines, cold plate 10 is relatively inexpensive and light in comparison to prior art cooling systems and heat pipes. FIGS. 3-5 show additional examples of cold plate 10.

FIG. 3 is a simplified top cross-sectional of another example of cold plate 10. In the example of FIG. 3, heat source 12 is blocked from view by cold plate 10. As shown in the example of FIG. 3, cold plate 10 can include first wick 24a, second wick 24b, and third wick 24c within liquid manifold 23 inside housing 16. Vapor manifold 26 includes first channel 34a and second channel 34b. Liquid manifold 23 includes first digit 36a and second digit 36b.

First channel 34a of vapor manifold 26 extends between housing 16 and first digit 36a of liquid manifold 23. Second channel 34b extends between first digit 36a and second digit 36b of liquid manifold 23. First wick 24a is positioned in first digit 36a of liquid manifold 23 and forms first interface 28a between first digit 36a of liquid manifold 23 and first channel 34a of vapor manifold 26. Second wick 24b is positioned in first digit 36a of liquid manifold 23 and forms second interface 28b between first digit 36a of liquid manifold 23 and second channel 34b of vapor manifold 26. Third wick 24c is positioned in second digit 36b of liquid manifold 23 and forms third interface 28c between second digit 36b of liquid manifold 23 and second digit 36b of liquid manifold 23. First digit 36a and second digit 36b are both fluidically connected to liquid inlet 21 such that liquid inlet 21 can supply liquid LQ to first wick 24a, second wick 24b, and third wick 24c.

During operation of cold plate 10, first channel 34a, second channel 34b, first digit 36a, and second digit 36b provide more interfacial surface and passageways that allow vapor V to more readily escape from first wick 24a, second wick 24b, and third wick 24c than an example with a single block-shaped wick. Furthermore, in application without gravity, or working against gravity, this interdigitated design can rely on the differential in surface tension between a working fluids liquid and vapor state to separate vapor and liquid at the interface between the porous media and the vapor outlet. First wick 24a, second wick 24b, and third wick 24c can also hold the same volume of liquid LQ as a single monolithic wick but with less capillary pressure as each of first wick 24a, second wick 24b, and third wick 24c can be thinner and less hydraulically resistive than a single block-shaped wick. With less capillary height requirements, first wick 24a, second wick 24b, and third wick 24c are less prone to "dry-out." "Dry-out" is a condition where a wick is unable to absorb liquid faster than the liquid is evaporating from the wick, causing the wick to dry out and underperform as a heat sink or cold plate. With lower capillary height requirements, first wick 24*a*, second wick 24*b*, and third wick 24*c* are able to absorb liquid LQ faster than liquid LQ can evaporate from first wick 24*a*, second wick 24*b*, and third wick 24*c*.

FIGS. 4 and 5 disclose another example of cold plate 10 with multiple wicks. FIG. 4 is a cross-sectional view of cold plate 10 in a width w and length L plane. FIG. 5 is a cross-sectional view of cold plate 10 in a length L and thickness t plane. In the example of FIG. 5, cold plate 10 includes first wick 24*a*, second wick 24*b*, third wick 24*c*, and fourth wick 24*d*. Vapor manifold 26 includes first channel 34*a*, second channel 34*b*, third channel 34*c*, fourth channel 34*d*, and main vapor line 38. Liquid manifold 23 includes first digit 36*a*, second digit 36*b*, third digit 36*c*, fourth digit 36*d*, and main liquid line 40.

As shown best in FIG. 4, first digit 36*a*, second digit 36*b*, third digit 36*c*, and fourth digit 36*d* of liquid manifold 23 are all fluidically connected to main liquid line 40. Main liquid line 40 is connected to liquid inlet 21 and supplies liquid LQ to first digit 36*a*, second digit 36*b*, third digit 36*c*, and fourth digit 36*d*. First channel 34*a*, second channel 34*b*, third channel 34*c*, and fourth channel 34*d* of vapor manifold 26 are all fluidically connected to and main vapor line 38. Main vapor line 38 fluidically connects first channel 34*a*, second channel 34*b*, third channel 34*c*, and fourth channel 34*d* to vapor outlet 22.

First wick 24*a* is positioned fluidically between first digit 36*a* of liquid manifold 23 and first channel 34*a* of vapor manifold 26 and forms first interface 28*a*. Second wick 24*b* is positioned fluidically between second digit 36*b* of liquid manifold 23 and second channel 34*b* of vapor manifold 26 and forms second interface 28*b*. Third wick 24*c* is positioned fluidically between third digit 36*c* of liquid manifold 23 and third channel 34*c* of vapor manifold 26 and forms third interface 28*c*. Fourth wick 24*d* is positioned fluidically between fourth digit 36*d* of liquid manifold 23 and fourth channel 34*d* of vapor manifold 26 and forms fourth interface 28*d*.

Similar to the example of FIG. 3, the example of cold plate 10 shown in FIGS. 4 and 5 provides more interfacial surfaces and passageways that can allow vapor V to more readily escape from first wick 24*a*, second wick 24*b*, third wick 24*c*, and fourth wick 24*d* than an example with a single block-shaped wick. First wick 24*a*, second wick 24*b*, third wick 24*c*, and fourth wick 24*d* can hold the same volume of liquid LQ as a single wick equal in size to the combined sizes of first wick 24*a*, second wick 24*b*, third wick 24*c*, and fourth wick 24*d*. However, first wick 24*a*, second wick 24*b*, third wick 24*c*, and fourth wick 24*d* can hold the liquid LQ with less capillary height requirements than the single wick since first wick 24*a*, second wick 24*b*, third wick 24*c*, and fourth wick 24*d* are each less hydraulically resistive than a single wick. With less capillary height requirements, first wick 24*a*, second wick 24*b*, third wick 24*c*, and fourth wick 24*d* are less prone to dry-out. With lower capillary height requirements, first wick 24*a*, second wick 24*b*, and third wick 24*c* are able to absorb liquid LQ faster than liquid LQ can evaporate from first wick 24*a*, second wick 24*b*, third wick 24*c*, and fourth wick 24*d*. Liquid inlet 21 can be connected to a liquid reservoir, such as liquid reservoir 18 shown in FIG. 1. In other examples, the example of cold plate 10 in FIGS. 4 and 5 can have enough liquid LQ stored within liquid manifold 23 too cool heat source 12 for the entire operational life of heat source 12, such that cold plate 10 does not need an exterior liquid reservoir. An example of liquid reservoir 18 is discussed below with reference to FIGS. 6 and 7.

Figures 6, 7:
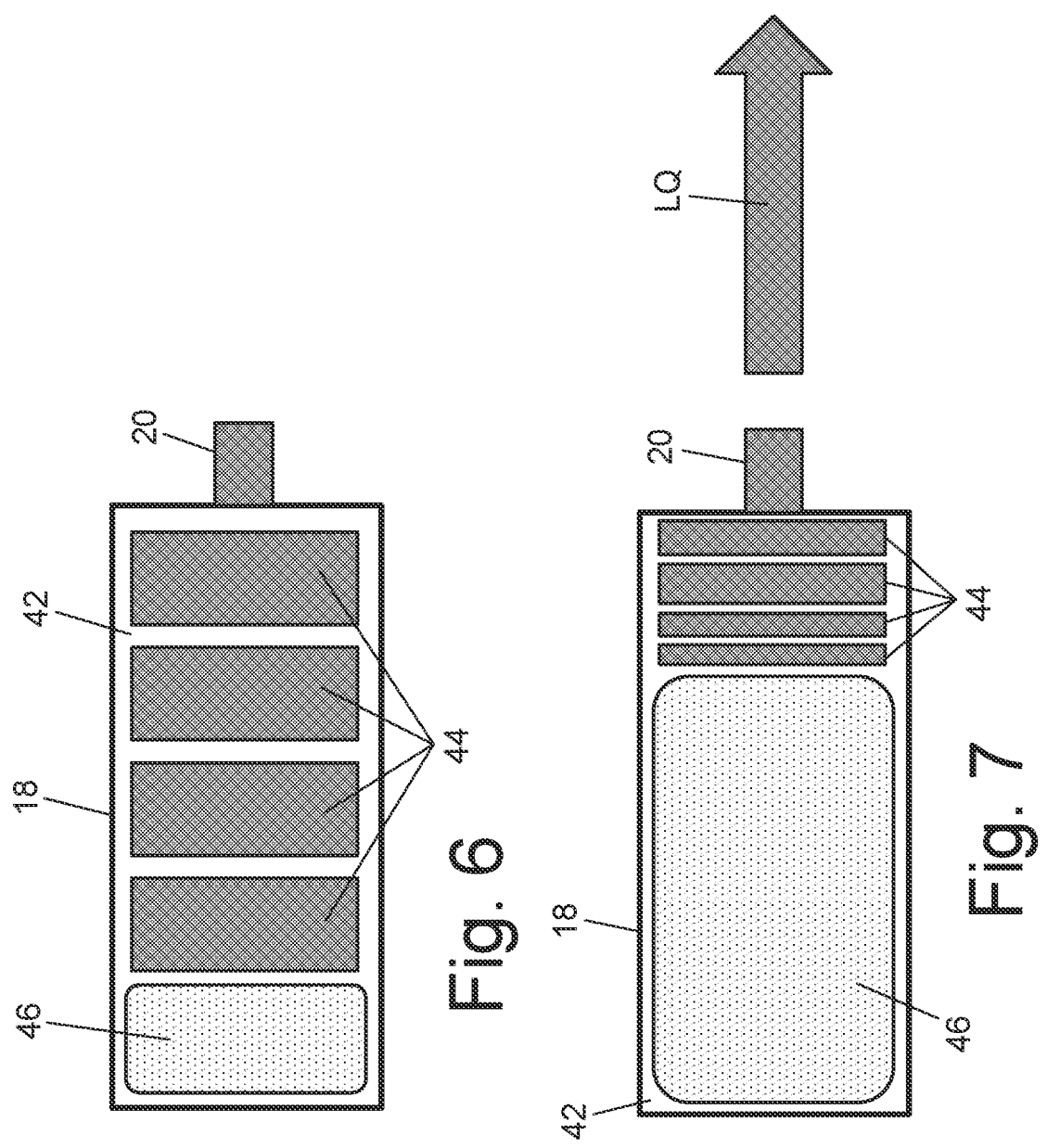
FIG. 6 is a simplified cross-sectional view of a liquid reservoir for a cold plate.
FIG. 7 is another simplified cross-sectional view of the liquid reservoir of FIG. 6 under low atmospheric pressure.

FIGS. 6 and 7 will be discussed concurrently. FIG. 6 is a simplified cross-sectional view of liquid reservoir 18 for cold plate 10 under a first atmospheric pressure. FIG. 7 is another simplified cross-sectional view of liquid reservoir 18 from FIG. 6 but in a lower pressure environment than the first atmospheric pressure of FIG. 6. As shown in the examples of FIGS. 6 and 7, liquid reservoir 18 can include an interior enclosure 42 filled by sponges 44 and air bag 46. Sponges 44 are saturated with liquid LQ and air bag 46 includes an elastic bag filled with a gas. The elastic bag of air bag 46 can be made of rubber or any other elastic material that allows air bag 46 to expand in volume. While liquid reservoir 18 and cold plate 10 are located in an environment with the first atmospheric pressure, as shown in FIG. 6, air bag 46 remains at a first volume and sponges 44 remain saturated with liquid LQ and uncompressed.

When liquid reservoir 18 and cold plate 10 are carried to an environment where the pressure is below the first atmospheric pressure, such as the stratosphere or space, the gas inside air bag 46 can expand in volume and cause air bag 46 to increase in volume and squeeze sponges 44. As air bag 46 squeezes sponges 44, air bag 46 forces liquid LQ out of sponges 44 and force liquid LQ through liquid line 20 and into liquid manifold 23 (shown in FIGS. 1-5). The expanded size of liquid reservoir 18 applies a constant pressure on liquid LQ such that liquid LQ continues to flow towards liquid manifold 23 and wick 24 even if liquid reservoir 18 and cold plate 10 are in a low gravity environment. Air bag 46 acts as a pump to supply liquid LQ from liquid reservoir 18 to liquid manifold 23 but is much lighter, simpler, and cost-effective than a mechanical pump. If liquid reservoir 18 experiences freezing temperatures, sponges 44 and air bag 46 can also compress to allow liquid LQ to freeze without damaging or bursting liquid reservoir 18.

Figures 8, 9, 10, 11:
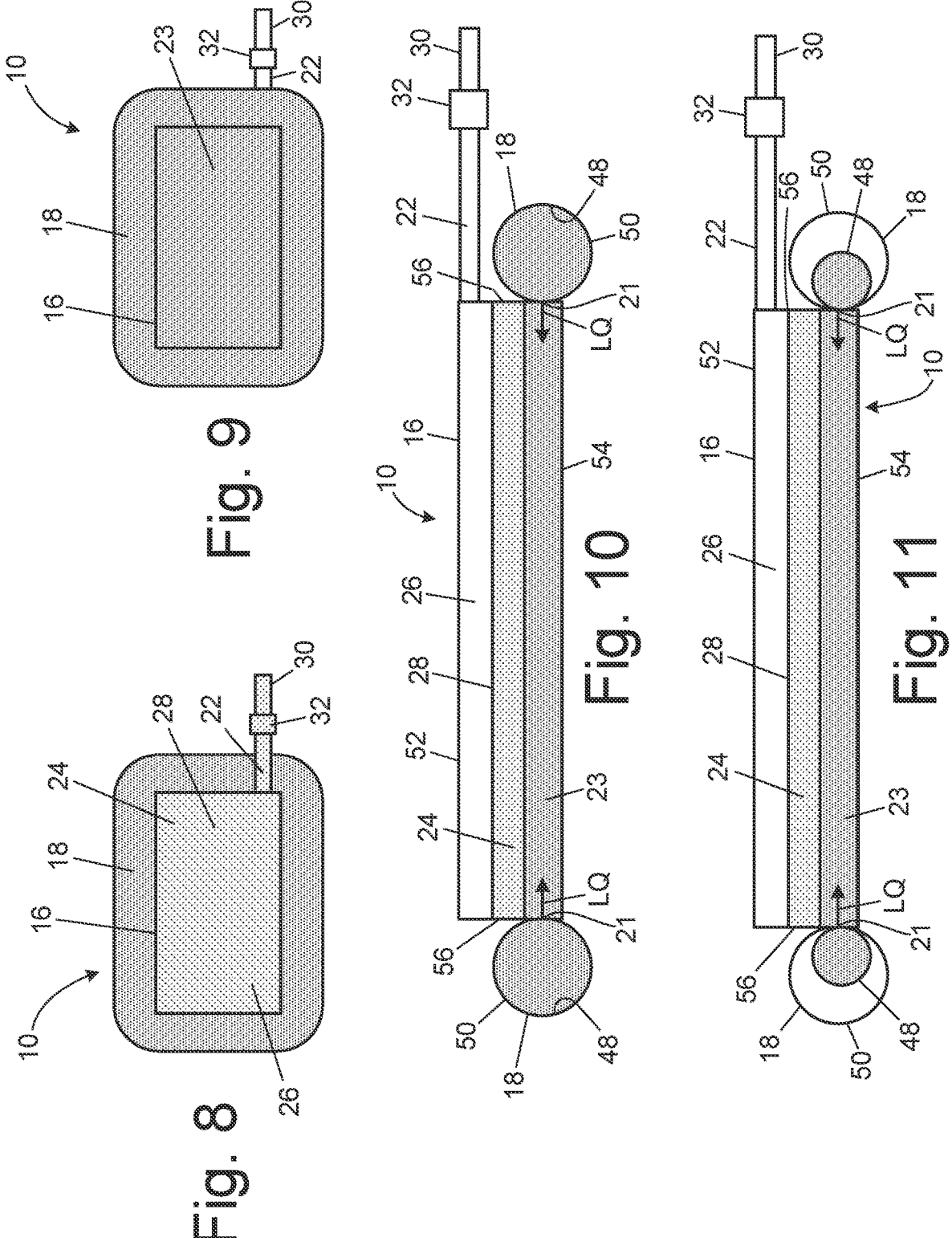
FIG. 8 is a simplified top cross-sectional view of another embodiment of a cold plate.
FIG. 9 is a simplified bottom cross-sectional view of the cold plate from FIG. 8.
FIG. 10 is a simplified side cross-sectional view of the cold plate from FIG. 8 with a full liquid reservoir.
FIG. 11 is a simplified side cross-sectional view of the cold plate from FIG. 8 with a partially filled liquid reservoir.

FIGS. 9-11 show another example of cold plate 10 and will be discussed concurrently. FIG. 8 is a simplified top cross-sectional view of cold plate 10 and FIG. 9 is a simplified bottom cross-sectional view of cold plate 10 from FIG. 8. FIG. 10 is a simplified side cross-sectional view of cold plate 10 from FIG. 8 with a full liquid reservoir 18. FIG. 11 is a simplified side cross-sectional view of cold plate 10 from FIG. 8 with a partially filled liquid reservoir 18. As shown in FIGS. 8-11, cold plate 10 includes housing 16, liquid reservoir 18, liquid inlets 21, vapor outlet 22, liquid manifold 23, wick 24, vapor manifold 26, interface 28, vapor tube 30, and check valve 32. Liquid reservoir 18 includes collapsible liner 48 and shell 50. Housing 16 of cold plate 10 includes top surface 52, bottom surface 54, and side surfaces 56.

Top surface 52 of housing 16 is opposite bottom surface 54 of housing 16. Side surfaces 56 extend between top surface 52 and bottom surface 54 and form an edge and perimeter of housing 16. Liquid manifold 23 is disposed inside housing 16 and is against bottom surface 54 of housing 16. Vapor manifold 26 is also inside housing 16 and is against top surface 52 of housing 16. Wick 24 is inside housing 16 and is positioned between vapor manifold 26 and liquid manifold 23. Wick 24 forms interface 28 between vapor manifold 26 and liquid manifold 23. Wick 24 in the example of FIGS. 8-11 can be configured and operates as discussed above with reference to FIGS. 1-2.

Vapor outlet 22 extends through housing 16 to fluidically connect to vapor manifold 26. Vapor tube 30 is connected to vapor outlet 22 to direct vapor V that exits out of vapor manifold 26. Vapor tube 30 can fluidically connect vapor outlet 22 to an external environment, such as atmosphere or space. For example, if cold plate 10 is connected to electronics within a missile, vapor tube 30 can vent cold plate 10 to an exterior of the missile, or to a safe space within the missile. Check valve 32 is fluidically connected to vapor outlet 22 and fluidically connects vapor outlet 22 to vapor tube 30. Check valve 32 is designed to open when pressure within the compartment of housing 16 exceeds approximately the low pressure required to open the check valve. If cold plate 10 is used in a low atmosphere environment, such as the stratosphere or space, check valve 32 keeps the compartment of housing 16 pressurized and prevents a vacuum from occurring within housing 16 that could cause liquid LQ to boil too quickly out of wick 24.

Liquid reservoir 18 in the example of FIGS. 8-11 is connected directly to side surfaces 56 of housing 16 and extends along the perimeter of housing 16. Liquid inlets 21 extend through side surfaces 56 of housing 16 to fluidically connect liquid manifold 23 to an interior of collapsible liner 48 of liquid reservoir 18. Collapsible liner 48 is inside shell 18 of liquid reservoir 18. Collapsible liner 48 holds liquid LQ inside liquid reservoir 18. Collapsible liner 48 can be formed of an elastic material that exerts a pressure sufficient to maintain liquid contact between LQ in the liquid manifold 23 and the wick 24. By exerting pressure against liquid LQ, collapsible liner 48 maintains liquid contact that allows the porous media to use capillary pressure to supply liquid LQ to the wick 24 even when liquid reservoir 18 and cold plate 10 are in a low gravity environment. Shell 18 surrounding collapsible liner 48 can be rigid to prevent collapsible liner 48 from expanding too much when liquid reservoir 18 and cold plate 10 are in a low gravity and/or low pressure environment. In other examples, a balloon or air bag can also be within shell 18 next to collapsible liner 48. A hole can extend through shell 18 to connect an interior of shell 18 with outside atmospheric pressure. When the atmospheric pressure drops outside of shell 18, gas inside of the balloon or the airbag will expand and cause the balloon or the airbag to exert pressure against collapsible liner 48 and compress collapsible liner 48 to force liquid LQ into liquid manifold 23.

Figures 12, 13:
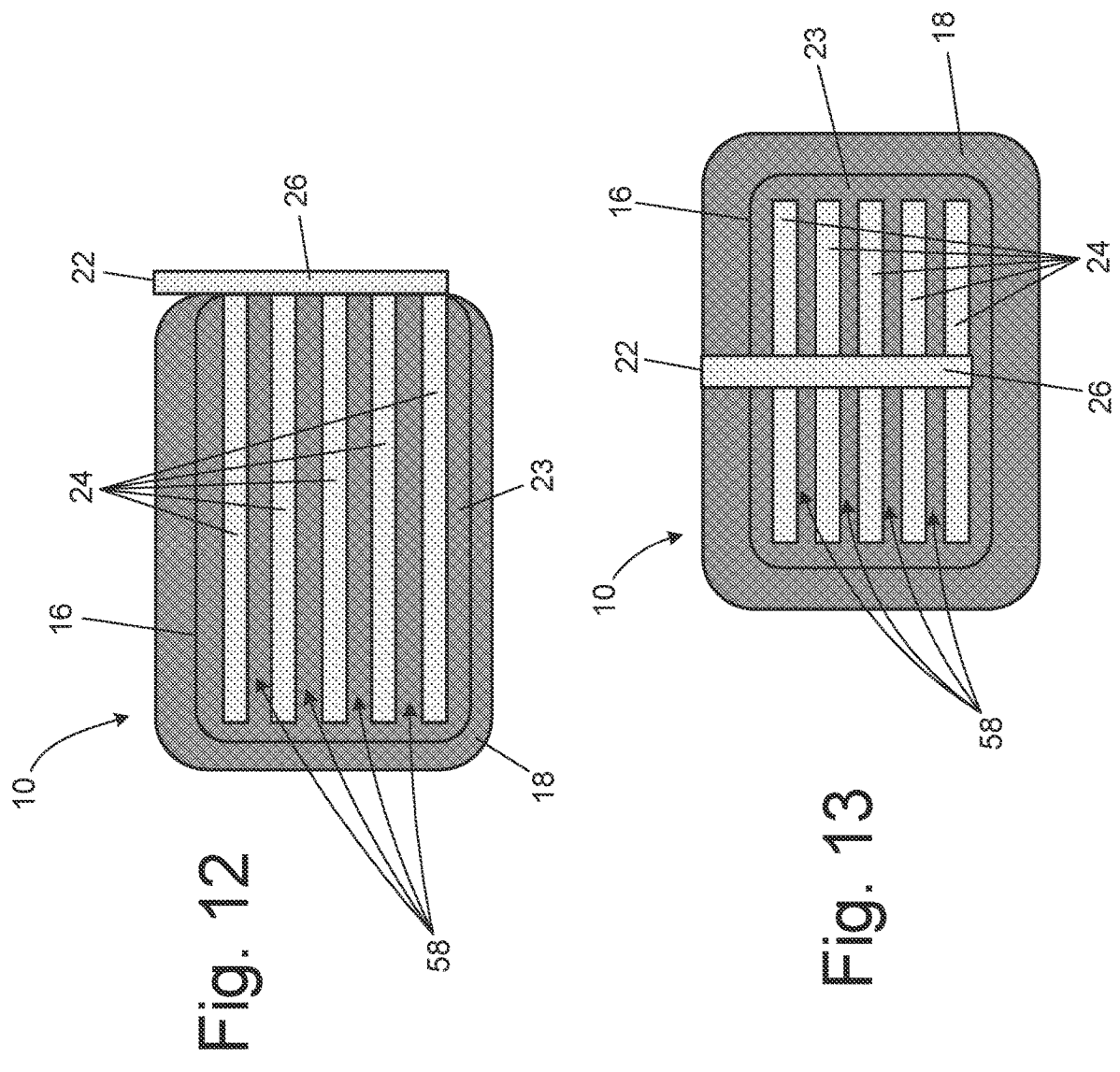
FIG. 12 is a simplified top cross-sectional view of another embodiment of a cold plate.
FIG. 13 is a simplified top cross-sectional view of another embodiment of a cold plate.

FIGS. 12 and 13 show variations of cold plate 10 from FIGS. 8-11 with slots 58 are formed through a thickness of wick 24 such that wick 24 is segmented. Segmenting wick 24 increases the interfacial surfaces of wick 24 with the vapor manifold. Increasing the surface area of wick 24 reduces the capillary height requirements of wick 24. Reducing the capillary height requirements of wick 24 allows wick 24 to absorb liquid LQ faster than liquid LQ can evaporate and exit wick 24 as vapor V. In this manner, wick 24 stays charged and saturated with liquid LQ and does not experience dry-out before the end of the operational life of the heat source attached to cold plate 10. Should the liquid LQ in wick 24 freeze, the slots in wick 24 also provide space for the liquid LQ to expand, which prevents frozen liquid LQ from damaging housing 16 of cold plate 10.

Discussion of Possible Embodiments

The following are non-exclusive descriptions of possible embodiments of the present invention.

In one embodiment, a cold plate for cooling a heat source includes a housing enclosing a compartment. A liquid manifold is inside the compartment and a vapor manifold inside the compartment. A wick forms an interface between the liquid manifold and the vapor manifold. An inlet is fluidically connected with the liquid manifold, and an outlet fluidically connects the vapor manifold to atmosphere or space. A liquid reservoir is fluidically connected to the liquid inlet.

The cold plate of the preceding paragraph can optionally include, additionally and/or alternatively, any one or more of the following features, configurations and/or additional components:

A further embodiment of the foregoing cold plate, wherein a check valve is connected to the outlet, wherein the check valve fluidically connects the outlet to atmosphere when a pressure within the compartment exceeds an opening pressure of the check valve.

A further embodiment of any of the foregoing cold plates, wherein an air bag is within the liquid reservoir, wherein the air bag comprises an elastic bag filled with a gas; and a sponge is within the liquid reservoir and is saturated with a liquid.

A further embodiment of any of the foregoing cold plates, wherein the wick comprises a porous material with pores that are non-uniform in size.

A further embodiment of any of the foregoing cold plates, wherein the wick comprises a porous material with pores that increase in size as the pores extend toward the interface of the vapor manifold.

A further embodiment of any of the foregoing cold plates, wherein the liquid reservoir comprises: a shell; and a collapsible liner within the shell and filled with a liquid, and wherein the collapsible liner is fluidically connected to the liquid inlet.

A further embodiment of any of the foregoing cold plates, wherein the housing comprises a top surface opposite a bottom surface, and wherein the liquid reservoir extends along an edge of the housing between the top surface and the bottom surface.

A further embodiment of any of the foregoing cold plates, wherein the vapor manifold comprises a plurality of slots extending through a thickness of the wick.

A further embodiment of any of the foregoing cold plates, wherein a first wick is in the liquid manifold and forms a first interface between the liquid manifold and the vapor manifold; a second wick is in the inlet manifold and forms a second interface between the liquid manifold and the vapor manifold; and wherein the vapor manifold comprises a channel extending between the first wick and the second wick.

A further embodiment of any of the foregoing cold plates, wherein the liquid reservoir forms a perimeter of the cold plate.

In another embodiment, a cold plate is disclosed for cooling electronics within a missile. The cold plate includes a housing enclosing a compartment. An outlet manifold is inside the compartment. A wick is inside the compartment and is adjacent to the outlet manifold. A liquid inlet is fluidically connected to the wick. A vapor outlet fluidically connects the outlet manifold to atmosphere or space.

The cold plate of the preceding paragraph can optionally include, additionally and/or alternatively, any one or more of the following features, configurations and/or additional components:

A further embodiment of the foregoing cold plate, wherein the outlet manifold comprises a plurality of slots extending through the wick.

A further embodiment of any of the foregoing cold plates, wherein an inlet manifold is in the compartment, wherein the inlet manifold fluidically connects the liquid inlet to the wick, and wherein the wick forms an interface between the inlet manifold and the outlet manifold.

A further embodiment of any of the foregoing cold plates, wherein a first wick is in the inlet manifold and forms a first interface between the first wick and the outlet manifold; a second wick is in the inlet manifold and forms a second interface between the second wick and the outlet manifold; and wherein the outlet manifold comprises a channel extending between the first wick and the second wick.

A further embodiment of any of the foregoing cold plates, wherein a check valve is connected to the vapor outlet, wherein the check valve fluidically connects the vapor outlet to atmosphere when a pressure within the compartment exceeds an opening pressure of the check valve above the vapor outlet pressure.

A further embodiment of any of the foregoing cold plates, wherein the wick comprises a porous material with pores that are non-uniform in size.

A further embodiment of any of the foregoing cold plates, wherein the wick comprises a porous material with pores that increase in size as the pores extend toward the interface.

A further embodiment of any of the foregoing cold plates, wherein a liquid reservoir is fluidically connected to the liquid inlet.

A further embodiment of any of the foregoing cold plates, wherein the liquid reservoir comprises: an air bag within the liquid reservoir, wherein the air bag comprises an elastic bag filled with a gas; and a sponge within the liquid reservoir and saturated with a liquid.

A further embodiment of any of the foregoing cold plates, wherein the liquid reservoir comprises: a shell; and a collapsible liner within the shell and filled with a liquid, and wherein the collapsible liner is fluidically connected to the liquid inlet.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. For example, while the invention has been discussed in the context of missiles, the invention can also be used in drones. Therefore, it is intended that the invention not be limited to the particular embodiment(s) disclosed, but that the invention will include all embodiments falling within the scope of the appended claims.

The invention claimed is:

1. A cold plate for cooling a heat source, the cold plate comprising:
   a housing enclosing a compartment;
   a liquid manifold inside the compartment;
   a vapor manifold inside the compartment;
   a wick forming an interface between the liquid manifold and the vapor manifold;
   an inlet fluidically connected with the liquid manifold;
   an outlet fluidically connecting the vapor manifold to atmosphere or space; and
   a liquid reservoir fluidically connected to the liquid inlet, wherein the liquid reservoir comprises an elastic liner that is collapsible and fluidically connected to the liquid inlet, and wherein the elastic liner is configured to:
      expand when filled with liquid;
      exert pressure on the liquid;
      and force the liquid into the liquid manifold.

2. The cold plate of claim 1, further comprising:
   a check valve connected to the outlet, wherein the check valve fluidically connects the outlet to atmosphere when a pressure within the compartment exceeds an opening pressure of the check valve.

3. The cold plate of claim 2, wherein the liquid reservoir comprises:
   an air bag within the liquid reservoir, wherein the air bag comprises an elastic bag filled with a gas; and
   a sponge within the liquid reservoir and saturated with a liquid.

4. The cold plate of claim 1, wherein the wick comprises a porous material with pores that are non-uniform in size.

5. The cold plate of claim 1, wherein the wick comprises a porous material with pores that increase in size as the pores extend toward the interface.

6. The cold plate of claim 1, wherein the liquid reservoir comprises:
   a rigid shell surrounding the elastic liner.

7. The cold plate of claim 6, wherein the housing comprises a top surface opposite a bottom surface, and wherein the liquid reservoir extends along an edge of the housing between the top surface and the bottom surface.

8. The cold plate of claim 1, further comprising:
   a first wick in the liquid manifold and forming a first interface between the liquid manifold and the vapor manifold;
   a second wick in the inlet manifold and forming a second interface between the liquid manifold and the vapor manifold; and
   wherein the vapor manifold comprises a channel extending between the first wick and the second wick.

9. The cold plate of claim 1, wherein the liquid reservoir forms a perimeter of the cold plate.

10. A cold plate for cooling electronics within a missile, the cold plate comprising:
   a housing enclosing a compartment;
   an outlet manifold inside the compartment;
   a wick inside the compartment adjacent to the outlet manifold;
   a liquid inlet fluidically connected to the wick;
   an elastic liner that is collapsible and fluidically connected to the liquid inlet; and
   a vapor outlet fluidically connecting the outlet manifold to atmosphere or space;
   wherein the elastic liner is configured to:
      expand when filled with liquid;
      exert pressure on the liquid;
      and force the liquid into the wick.

11. The cold plate of claim 10, further comprising:
   an inlet manifold in the compartment, wherein the inlet manifold fluidically connects the liquid inlet to the wick, and wherein the wick forms an interface between the inlet manifold and the outlet manifold.

12. The cold plate of claim 10, further comprising:
   a check valve connected to the vapor outlet, wherein the check valve fluidically connects the vapor outlet to atmosphere when a pressure within the compartment exceeds an opening pressure of the check valve.

13. The cold plate of claim 10, wherein the wick comprises a porous material with pores that are non-uniform in size.

14. The cold plate of claim 10, wherein the wick comprises a porous material with pores that increase in size as the pores extend toward the interface.

15. The cold plate of claim 10, further comprising:
   a rigid shell surrounding the elastic liner.

16. The cold plate of claim 15, wherein the liquid reservoir comprises:

an air bag within the liquid reservoir, wherein the air bag comprises an elastic bag filled with a gas; and a sponge within the liquid reservoir and saturated with a liquid.

17. The cold plate of claim 1, further comprising a liquid inside the elastic liner, and wherein the elastic liner exerts pressure on the liquid to fill the liquid manifold with the liquid, and press the liquid against the wick.

18. The cold plate of claim 6, further comprising a liquid inside the elastic liner, and wherein the elastic liner exerts pressure on the liquid to fill the liquid manifold with the liquid, and press the liquid against the wick.

\* \* \* \* \*